United States Patent [19]
Uno et al.

[11] Patent Number: 6,166,872
[45] Date of Patent: Dec. 26, 2000

[54] STORAGE APPARATUS

[75] Inventors: Hiroshi Uno; Nobuyuki Mitsunaga, both of Kawasaki, Japan

[73] Assignee: Fujitsu Limited, Kawasaki, Japan

[21] Appl. No.: 09/157,707

[22] Filed: Sep. 21, 1998

[30] Foreign Application Priority Data

Mar. 20, 1998 [JP] Japan ................... 10-072088

[51] Int. Cl.$^7$ ............... G11B 5/035; G11B 5/09
[52] U.S. Cl. ........................... 360/65; 360/46
[58] Field of Search .................. 360/65, 46, 67

[56] References Cited

U.S. PATENT DOCUMENTS 5,050,154  9/1991  Shimozawa et al. ............... 369/112
5,862,014  1/1999  Nute ..................................... 360/104

*Primary Examiner*—W. Chris Kim
*Attorney, Agent, or Firm*—Greer, Burns, & Crain, Ltd.

[57] ABSTRACT

A read signal from a head is amplified by a read amplifier disposed on a head actuator and is fed via a pair of read only transmission paths through an FPC to a control board. The read only transmission paths are provided with a compensation circuit consisting of an inductance and a resistor which are connected in parallel. The compensation circuit compensates for degradation of frequency characteristics of a read signal attributable to stray capacitance of the FPC and to stray capacitance on the control board side.

10 Claims, 14 Drawing Sheets

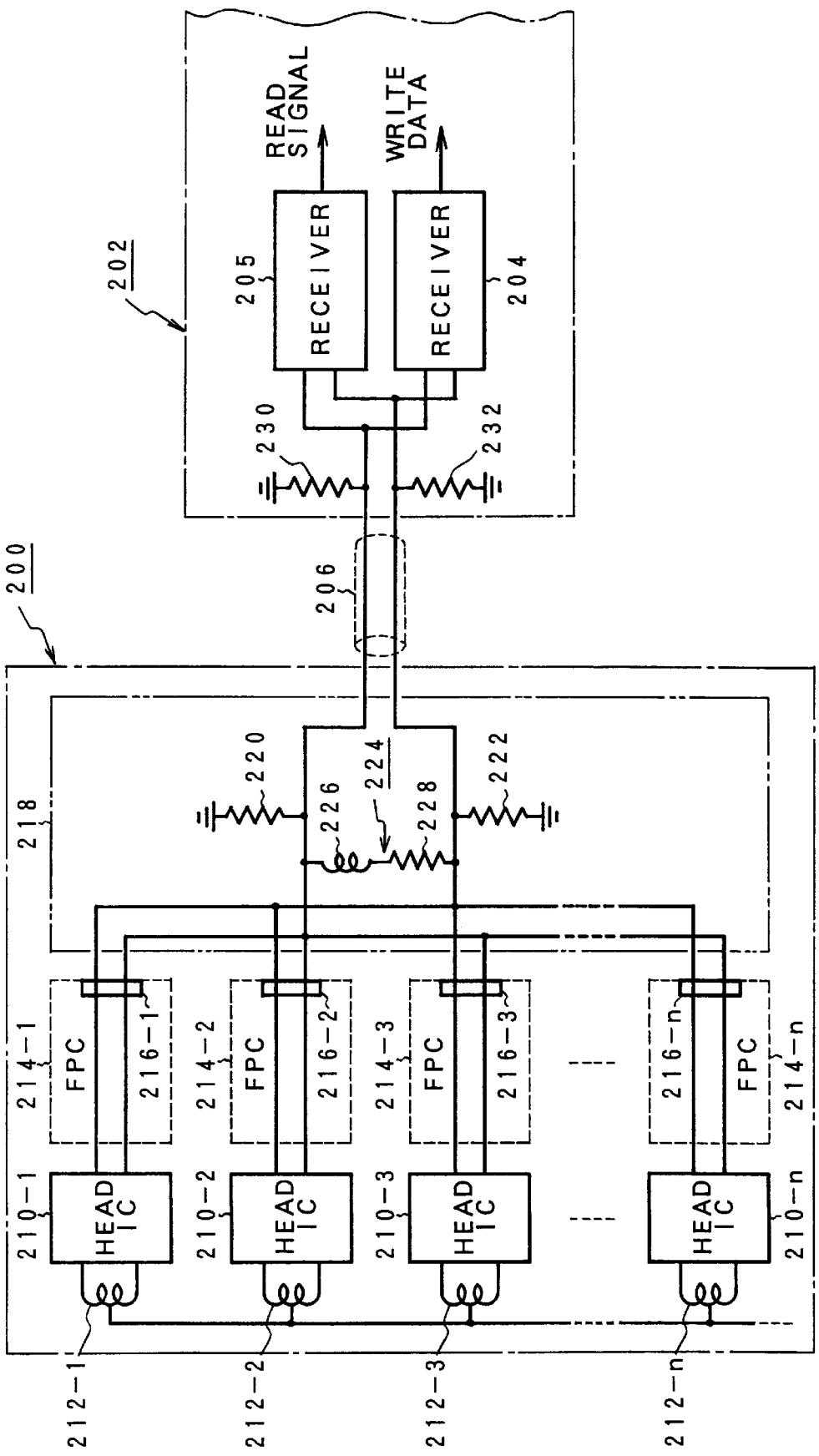

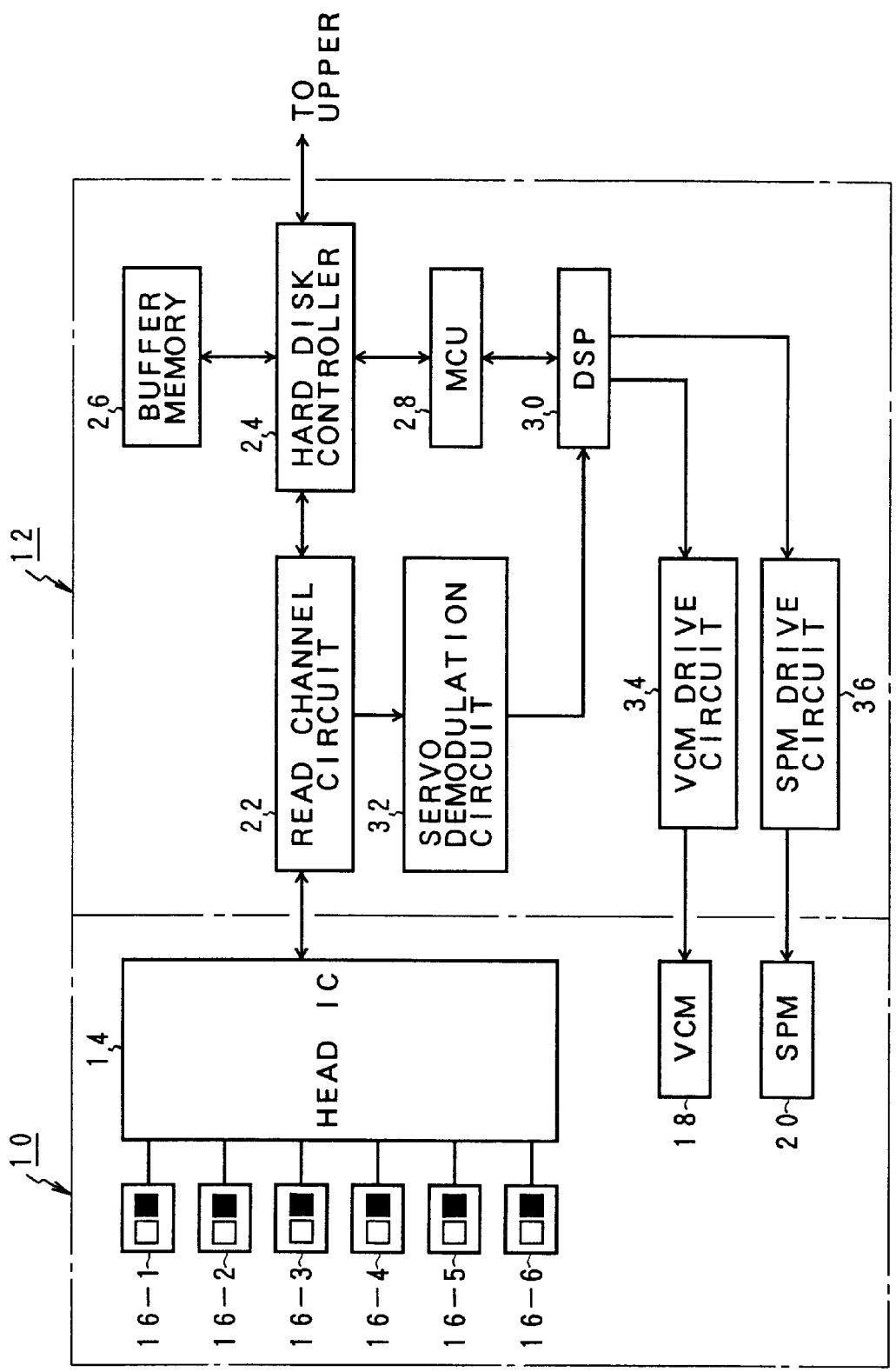

F I G. 4
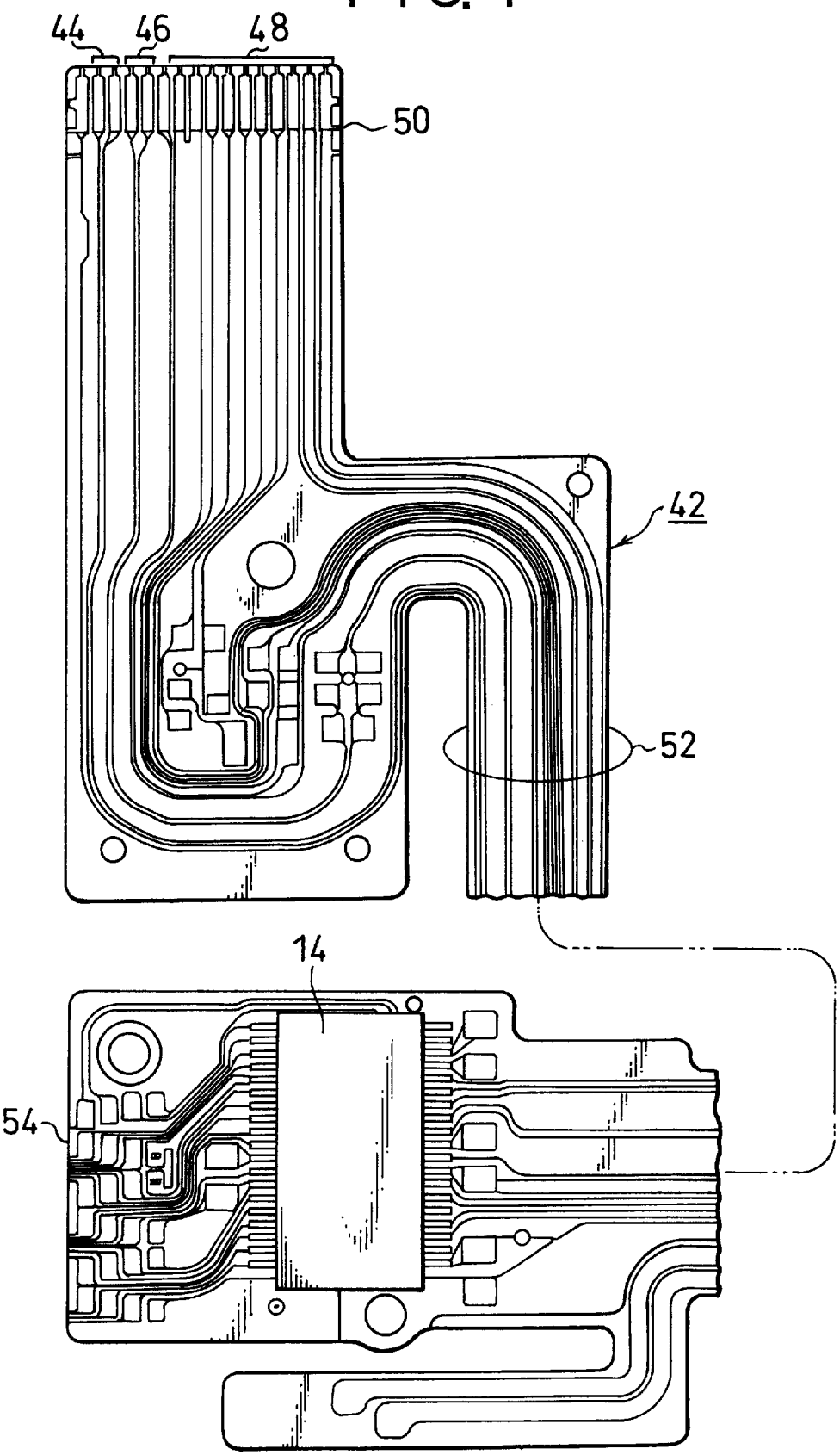

F I G. 8
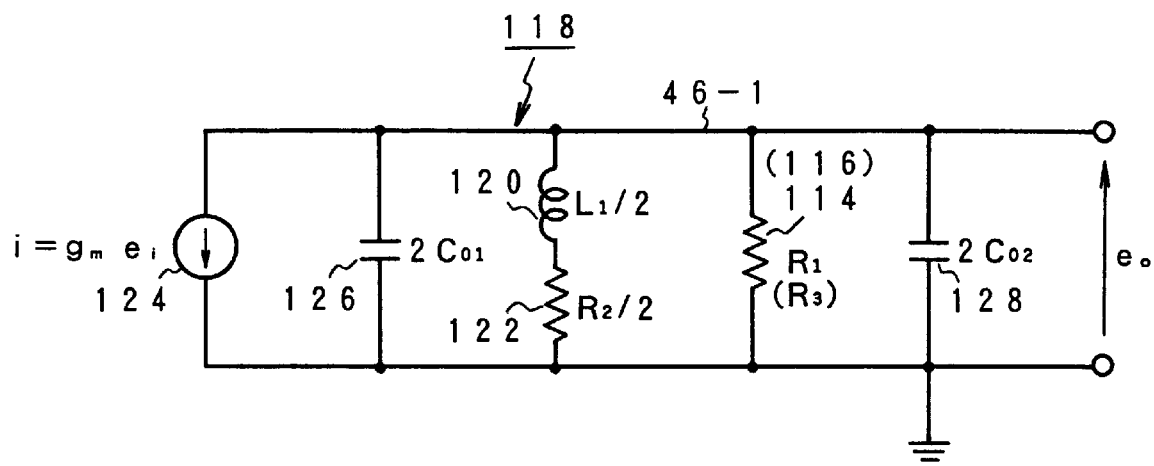

F I G. 1 1
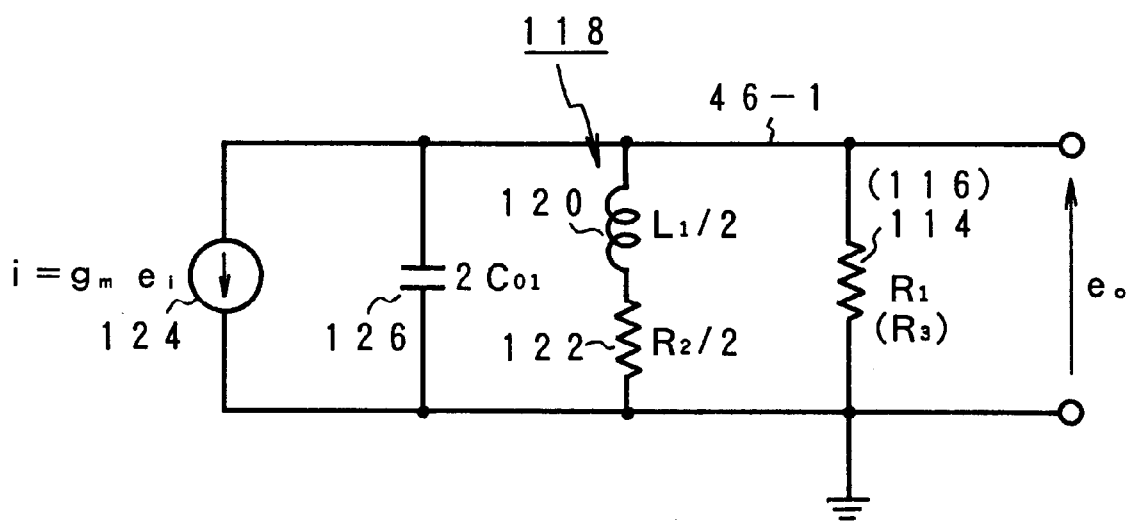

STORAGE APPARATUS

BACKGROUND OF THE INVENTION

1. Field of the Invention

The present invention relates generally to a storage apparatus for recording/reproducing information to/from a magnetic disk medium, and more particularly to a storage apparatus for a high speed data transfer, mounted with a head IC on its actuator side which connects to its fixed side by way of a flexible printed circuit.

2. Description of the Related Arts

Recent magnetic disk apparatuses tend to have a remarkably increased recording density. This needs a higher data transfer speed. FIG. 1 illustrates a conventional magnetic disk apparatus having a transmission system for read signals and write data in the form of a bidirectional transmission cable 206 of 1 to 2 meters in length connecting a head disk assembly (HDD) 200 and a control board 202 within a gate attached to a rocker. The head disk assembly 200 is provided with a head actuator for positioning a plurality of heads relative to a plurality of magnetic disks rotated by a spindle motor. The head actuator has a plurality of arms carrying at their extremities a plurality of magnetic heads 212-1 to 212-n for read and write and serves to position the magnetic heads 212-1 to 212-n by a voice coil motor (VCM). Between the head actuator and a circuit board 218 on the fixed side there are interposed a plurality of flexible printed circuits (hereinafter, referred to as FPCs) 214-1 to 214-n each having a predetermined length required for a motion of the actuator and having connectors 216-1 to 216-n for the connection to the circuit board 218. For this reason, the heads 212-1 to 212-n and the circuit board 218 are connected to one another by way of a differential signal line pattern (balanced line pattern) on the FPCs 214-1 to 214-n for the bi-directional transmission of analog read signals and digital write data.

The head ICs 210-1 to 210-n are mounted on the FPCs 214-1 to 214-n, respectively, attached to the arms of the head actuator. The head ICs 210-1 to 210-n incorporate a write amplifier for switching the polarity of a recording current through the magnetic heads 212-1 to 212-n in response to write data, and a preamplifier for amplifying a read analog voltage from the heads 212-1 to 212-n. The transmission lines from the head ICs 210-1 to 210-n are connected to one another in parallel on the circuit board 218. The circuit board 218 is provided with terminating resistors 220 and 222 for write data transmission and with a series circuit consisting of an inductance 226 and a resistor 228, for compensating for the frequency characteristic upon the read signal transmission. The circuit board 218 is connected to a read channel on the control board 202 by way of the bi-directional transmission cable 206. A sending/reception end on the read channel is provided with terminating resistors 230 and 232 for read signal transmission and with a driver 204 and a receiver 205.

With the increase in the data transfer speed, such a conventional magnetic disk apparatus requires a broader frequency band of the analog read signal. If the frequency band of the read signal is not broadened, a distortion in the waveform attributable to the attenuation of the high-frequency components may occur, preventing a correct reading, resulting in a reduction of the reproducing margin and hence in a reduction in the data reliability. A barrier to a broader read signal band is a degradation of the frequency characteristics attributable to the stray capacitance occurring between the transmission lines formed on the FPC 214-1 to 214-n and attributable to the stray capacitance occurring between the transmission lines and the ground. The FPC 214-1 to 214-n need a predetermined length for allowing a motion of the actuator, posing a limitation to the reduction of the electrostatic capacity. An output circuit of the preamplifier incorporated in the head ICs 210-1 to 210-n uses an open collector type differential amplifier as a driver for driving the bi-directional cable 206. However, this allows a connection of a plenty of stray capacitance parasitic on the wiring pattern of the FPC 214-1 to 214-n since the fixed side circuit board 218 bears a multiplicity of parallel-connected transmission lines from the FPC 214-1 to 214-n. This stray capacitance causes a remarkable degradation of the frequency characteristics of the analog read signal. In order to compensate for the degradation of the frequency characteristics attributable to the FPC 214-1 to 214-n, the inductance 226 and the resistor 228 are connected to each other in series between the transmission lines of the circuit board 218. In case of receiving the write data from the driver 204 of the control board 204, this compensation circuit may cause a reflection attributable to the mismatching of the impedance and deteriorate the write data transmission characteristics, posing a limitation to the improvement of the data transfer speed. It is also conceivable to change the output circuit of the preamplifier provided in the head IC 210-1 to 210-n from the high impedance open collector type to the low impedance emitter follower type subjected to less influence of the stray capacitance. However, this emitter follower type suffered from a problem that oscillation often takes place when a capacitive load is driven. The stray capacitance impairing the broadening of the read signal band may exist in not only the FPC 214-1 to 214-n provided on the disk head assembly 200 serving as the sending end of the bi-directional transmission cable 206 but also in the input circuit portion of the control board 202 serving as the reception end of the bidirectional transmission cable 206, allowing the stray capacitance at the receiving end to cause a further degradation of the frequency characteristics of the read signals.

SUMMARY OF THE INVENTION

According to an aspect of the present invention, there is provided a storage apparatus capable of minimizing the influence of the stray capacitance in a transmission path by way of the FPC, to thereby ensure a high speed transfer of analog read signals and write data.

In case of a storage apparatus of the present invention, an FPC electrically connects a fixed side and a head actuator for positioning a head relative to a disk medium, the FPC having a predetermined length required for a motion of the head actuator. A read amplifier is provided on the head actuator side, for amplifying an analog read signal from a head. An output signal from the read amplifier is fed via a pair of read only transmission paths through the FPC to a control board. The present invention is characterized in that such a storage apparatus further comprises a compensation circuit provided on the pair of read only transmission paths, for compensating for a degradation of the frequency characteristics of the read signal attributable to the stray capacitance of the FPC and to the stray capacitance on the control board side. By virtue of this compensation circuit, even though the read only signal lines allowed the existence of the stray capacitance arising from the FPC, it is possible to suppress an attenuation of the signal components at a high frequency band, to thereby broaden the band of the read signal transmission characteristics, consequently achieving a high speed read data transfer.

The compensation circuit includes an inductance and a resistor connected in series between the pair of read only transmission parts such that the inductance provided in the compensation circuit can compensate for a reduction in the transmission impedance of a read signal at a high frequency band attributable to the stray capacitance of the FPC and the reception ends of the control board, to thereby suppress the attenuation of the high frequency components for broadening the band. The compensation circuit includes an inductance and a resistor connected in series between the pair of read transmission paths and further includes a pair of terminating resistors each having one end connected to corresponding one of the pair of transmission paths and the other end connected to the ground. The compensation circuit includes an inductance and a resistor connected to in series between the pair of read only transmission paths and includes a pair of terminating resistors each having one end connected to corresponding one of the pair of transmission paths and the other end connected to the ground and further includes a pair of buffer amplifiers provided on the transmission paths, respectively, for eliminating stray capacitance on the control board side. This buffer amplifier is an emitter follower circuit. By providing the buffer amplifier to eliminate the stray capacitance on the control board side in this manner, the inductance of the compensation circuit can dedicate itself to the compensation for the stray capacitance of the FPC, which contributes to a reduction in size of the inductance 120. The compensation circuit is mounted on reception ends of the pair of read only transmission paths on the control board. Such a mounting of the compensation circuit on the control board reception ends enables the compensation circuit to serve as a part of the terminating resistors of the read only signal lines. By virtue of the compensation circuit compensating for the degradation of the frequency characteristics arising from the FPC stray capacitance, the output circuit of the read amplifier provided on the head actuator side can be a read buffer circuit of the open collector type.

The storage apparatus of the present invention comprises a write amplifier provided on the actuator side, for feeding a write current to the head to thereby record data on the disk medium. A pair of write only transmission paths are provided for feeding write data from the control board through the FPC to the write amplifier. A pair of terminating resistors for write transmission are interposed between the ground and the reception ends of the pair of write only transmission paths on the write amplifier. Since the write data are transmitted through the write only transmission paths separated from the read only signal lines in this manner, there arises no problem of a reflection loss attributable to the impedance mismatching by the compensation circuit provided on the read only signal lines, facilitating an increase of the write data transfer speed.

The storage apparatus of the present invention comprises a first data modulation circuit provided on the control board for providing a parallel output of the write data, a parallel write transmission path through which parallel write data from the first write modulation circuit is fed via the FPC to the actuator side, and a second write modulation circuit provided on the actuator side for converting the parallel write data transferred by the second write modulation circuit into serial write data for the output to the write amplifier. The first write modulation circuit mounted on the control board includes a scrambler and an RLL encoder, and the second write modulation circuit mounted on the head actuator side includes a parallel/series converter, a precoder and a write compensation circuit. By employing the parallel write data transmission as the write data transmission from the control board to the actuator, a 1/N write data transfer speed can be obtained if the parallel bit number is N, thereby achieving a remarkable improvement in the serial write data transfer speed.

The above and other objects, aspects, features and advantages of the present invention will become more apparent from the following detailed description with reference to the accompanying drawings.

BRIEF DESCRIPTION OF THE DRAWINGS

FIG. 1 is an explanatory diagram of a data transmission system of a magnetic disk apparatus using a conventional FPC;

FIG. 2 is a block diagram of a hard disk drive in accordance with the present invention;

FIG. 4 is an explanatory diagram of an FPC in an extracted manner interposed between a head actuator of FIG. 3 and the casing;

FIG. 8 illustrates an equivalent circuit of a read transmission system provided with the compensation circuit of FIG. 7;

FIG. 11 illustrates an equivalent circuit of the read transmission system provided with the compensation circuit of FIG. 10;

DETAILED DESCRIPTION OF THE PREFERRED EMBODIMENTS

Figure 3:
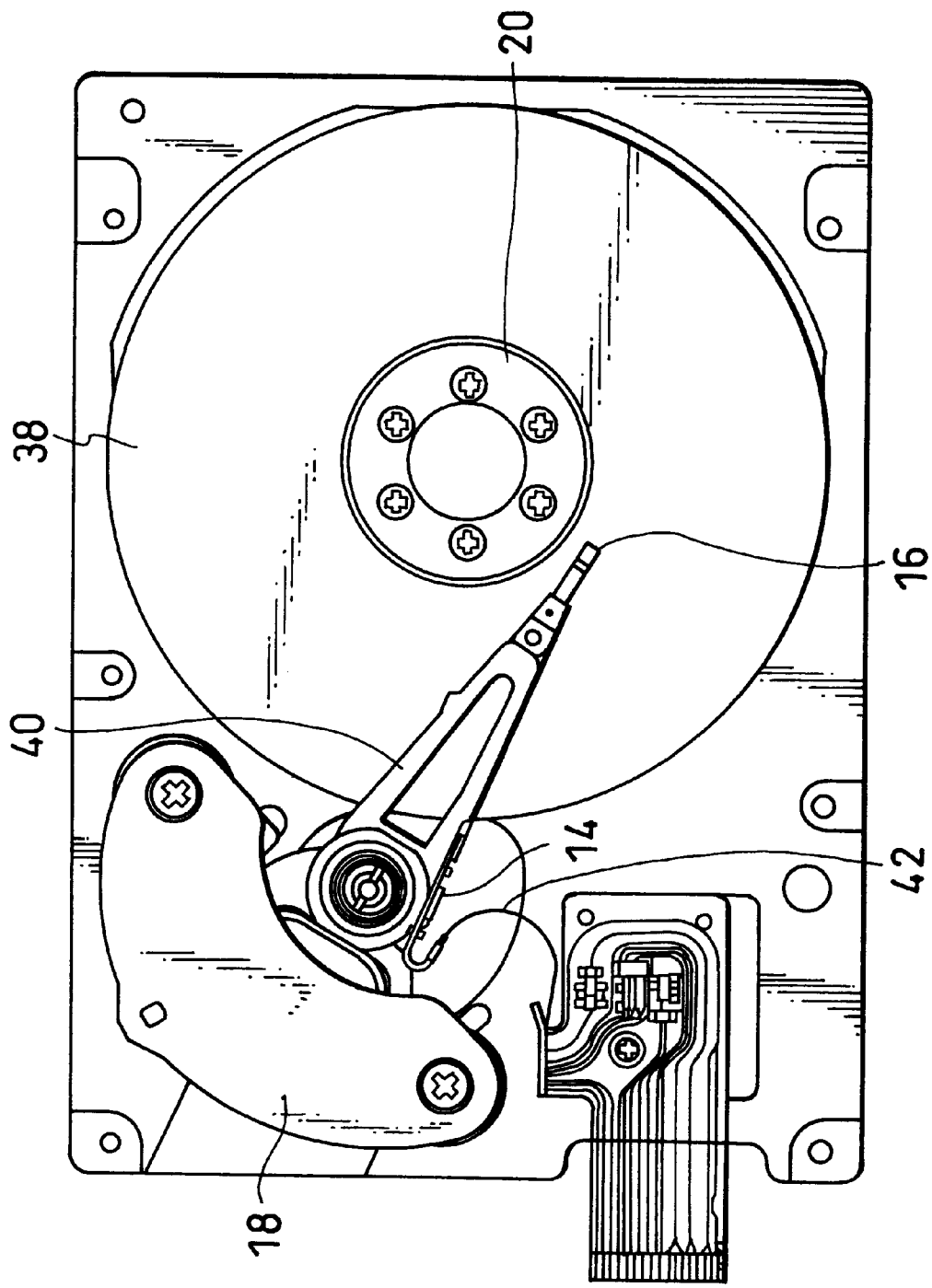
FIG. 3 is an explanatory diagram of an internal structure of a head disk assembly of FIG. 2.

FIG. 2 is a block diagram of a magnetic disk drive which is an embodiment of a storage apparatus in accordance with the present invention. The hard disk drive is constituted by a head disk assembly 10 and a control board 12. The head disk assembly 10 comprises a head IC 14 to which are connected six head assemblies 16-1 to 16-6 in this embodiment. The head assemblies 16-1 to 16-6 are each in the form of a composite head integrally provided with an inductive head 56 serving as a write head and with an MR head 58 serving as a read head. The head assembly 10 further comprises a voice coil motor (hereinafter, referred to as a VCM) 18 for driving a head actuator and a spindle motor (hereinafter, referred to as an SPM) 20 for turning a disk medium. The head IC 14 of the head disk assembly 10 is associated with a read channel circuit (RDC) 22, a hard disk controller (HDC) 24, a buffer memory 26, an MCU (micro control unit) 28, a DSP (digital signal processor) 30, a servo demodulation circuit 32, a VCM drive circuit 34 and an SPM drive circuit 36 which constitute the control board 12. The hard disk controller 24 provides an interface control for receiving/sending various commands and data from/to an upper apparatus and issues an intra-apparatus control signal for the control of a recording/reproduction format on the magnetic disk medium. The MCU 28 is comprised of a microprocessor and uses a program stored in its memory to provide a control of the hard disk controller 24, a control of the DSP 30 and a control of the buffer memory 26. The buffer memory 26 is used for a temporary storage of write data from the upper apparatus and a temporary storage of read data from the magnetic disk medium. The DSP 30 is comprised of a processor for providing a servo control of head positioning of the head assemblies 16-1 to 16-6 and performs, on the basis of programs stored in the memory, a recognition of a position signal from the servo demodulation circuit 32, a control of a drive current of the VCM 18 supplied by the VCM drive circuit 34, and a control of the number of turns of the magnetic disk through a control of a drive current of the SPM 20 supplied by the SPM drive circuit 36. The VCM drive circuit 34 is a power amplifier which allows the VCM 18 provided in the head assembly 10 to turn the head assemblies 16-1 to 16-6 supported at the arm extremity of the head actuator to thereby provide a positioning control. The SPM drive circuit 36 is a power amplifier which supplies a drive current to the SPM 20 for turning the magnetic disk disposed in the head disk assembly 10. The read channel circuit 22 includes a write demodulation circuit for recording write data from the upper apparatus on the magnetic disk medium and a read demodulation circuit for reproducing data from a read signal read from the magnetic disk medium. The servo demodulation circuit 32 acquires from the read channel circuit 22 a servo signal contained in a read signal obtained by reading a servo pattern for positioning recorded on the magnetic disk medium, and demodulates a head position signal from the servo signal by means of the peak hold, integral, etc.

FIG. 3 illustrates in plan an internal structure of the hard disk drive of FIG. 2 with its top cover removed. A head actuator 40 turns on its turning center at a corner of its casing in such a manner as to confront a plurality of magnetic disk media 38. The plurality of magnetic disk media 38 are fixedly attached to a turning shaft of the SPM 20 in a stacked manner. For example, in case of provision of six head assemblies 16-1 to 16-6 as in the head disk assembly 10 of FIG. 2, three magnetic disk media 38 are fixedly attached to the turning shaft of the SPM 20 in a stacked manner. The three magnetic disk media 38 have a total of six recording surfaces which are accessed by the head assemblies 16-1 to 16-6. Since the head actuator 40 of FIG. 3 is associated with the three magnetic disk media 38 having six recording surfaces, it has four arms extending over the magnetic disk media 38 and carrying at their extremities the head assemblies 16-1 to 16-6. The VCM 18 is disposed on the opposite side to the head actuator 40. An FPC 42 is interposed between the head actuator 40 and the casing which is the stationary side. The FPC 42 has one end secured to the lateral side of the head actuator 40 and the other end secured to the casing, the FPC 42 having a U-shape with a predetermined length allowing the head actuator 40 to move. The securing portion of FPC 42 to the lateral side of the head actuator 40 is mounted with a head IC 14 provided on the head disk assembly 10 of FIG. 2.

FIG. 4 illustrates in plan the FPC 42 of FIG. 3 in an extracted manner with its part eliminated. The FPC includes three sections, that is, an upper control board connecting section 50, an intermediate band section 52 which is a modified section and a lower head connecting section 54 to be secured to the lateral side of the head actuator 40. Extending from the control board connecting section 50 are patterns for a write only transmission path 44 and a read only transmission path 46, as well as a plurality of control transmission paths 48 for the control of the head IC. The write only transmission path 44, read only transmission path 46 and control transmission path 48 extend, through the band section 52 at which the FPC 42 has a smallest width, to the head connecting section 54 secured to the lateral side of the head actuator, with the head connecting section 54 being mounted with the head IC 14.

Figure 5:
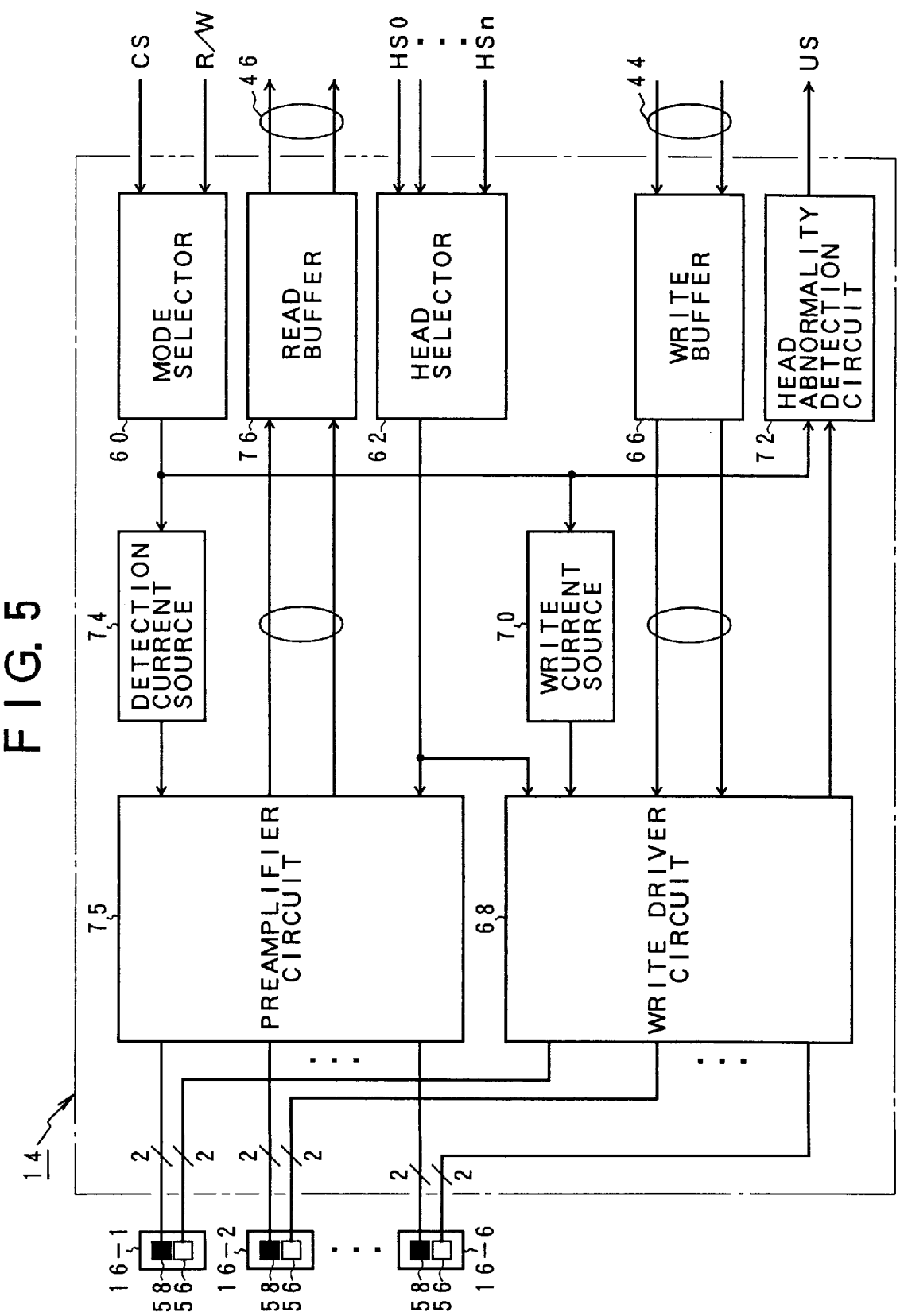
FIG. 5 is a circuit block diagram of a head IC of FIG. 2.

FIG. 5 is a block diagram of the head IC 14 mounted on the FPC 42 on its head actuator mounting side. The head IC 14 comprises a mode selector 60 which receives a chip select signal CS and a read/write switching signal R/W from a control board 12 to provide a setting of read mode action or write mode action. The head IC 14 further comprises a write driver circuit 68 and a preamplifier 75. The write driver circuit 68 includes a write driver to which is entered an output from a write buffer 66 and a corresponding number of write driver output circuits for write inductive heads 56 provided in the head assemblies 16-1 to 16-6. In response to plural bits of head selector signals HS0 to HSn from the control board 12, corresponding one of the write driver output circuits is activated, allowing a selection of a specific inductive head 56 from among the head assemblies 16-1 to 16-6. The preamplifier circuit 75 includes a corresponding number of preamplifier first stage circuits for the read MR head 58 provided in the head assemblies 16-1 to 16-6, and a preamplifier for performing a common entry to the plurality of preamplifier first stage circuits and amplifying the input signal and then providing it as its output to a read buffer 72. Thus, in response to plural bits of head selector signals HS0 to HSn from the control board 12, corresponding one of the preamplifier initial stage circuits goes active, allowing a selection of one MR head 58 from among the head assemblies 16-1 to 16-6. The write only transmission path 44 of the FPC 42 of FIG. 4 is connected to a write buffer 66 of the head IC 14, with an output from the write buffer 66 being fed to the write driver circuit 68. In a manner corresponding to the write driver circuit 68 there are provided a write current source 70 and a head abnormality detection circuit 72 for detecting an abnormality of a write current. Upon the writing action, a write mode signal from the mode selector 60 goes effective, allowing the write driver circuit 68, the write current source 70 and the head abnormality detection circuit 72 to go active. For this reason, in response to a selection signal from the head selector 62, corresponding one of the write driver output circuits within the write driver circuit 68 goes active, allowing a selection of one of the inductive heads 56 of the head assemblies 16-1 to 16-6. Afterward, the write buffer 66 receives write data fed via the write data only transmission path 44 from the control board 12. In response to a bit inversion, for example, the active driver output circuit in the write driver circuit 68 inverts the direction of a write current fed to the inductive head 56 from the write current source 70, allowing a record on the magnetic disk media. In response to a selection signal from the head selector 62, the preamplifier 75 puts one of the plurality of built-in preamplifier first stage circuits into an operative state, allowing a selection one of the MR heads 58 provided in the head assemblies 16-1 to 16-6. In this case, the MR heads 58 provided in the head assemblies 16-1 to 16-6 need a sense current which is derived from a detection circuit source 74. For this reason, upon the read action, a read mode signal from the mode selector 60 goes effective, allowing the detection current source 74 and the preamplifier circuit 75 to go active. The preamplifier circuit 75 amplifies an analog read signal from one of the MR heads 58 which has been selected, and thereafter transmits it via the read buffer 76 and through the read only transmission path 46 of the FPC 42 of FIG. 4 to the control board 12. The read buffer 76 constitutes an output circuit of the preamplifier 75 and employs a circuit configuration of an open collector form. For this reason, the preamplifier 75 and the read buffer 76 constitute a read amplifier.

Figure 6:
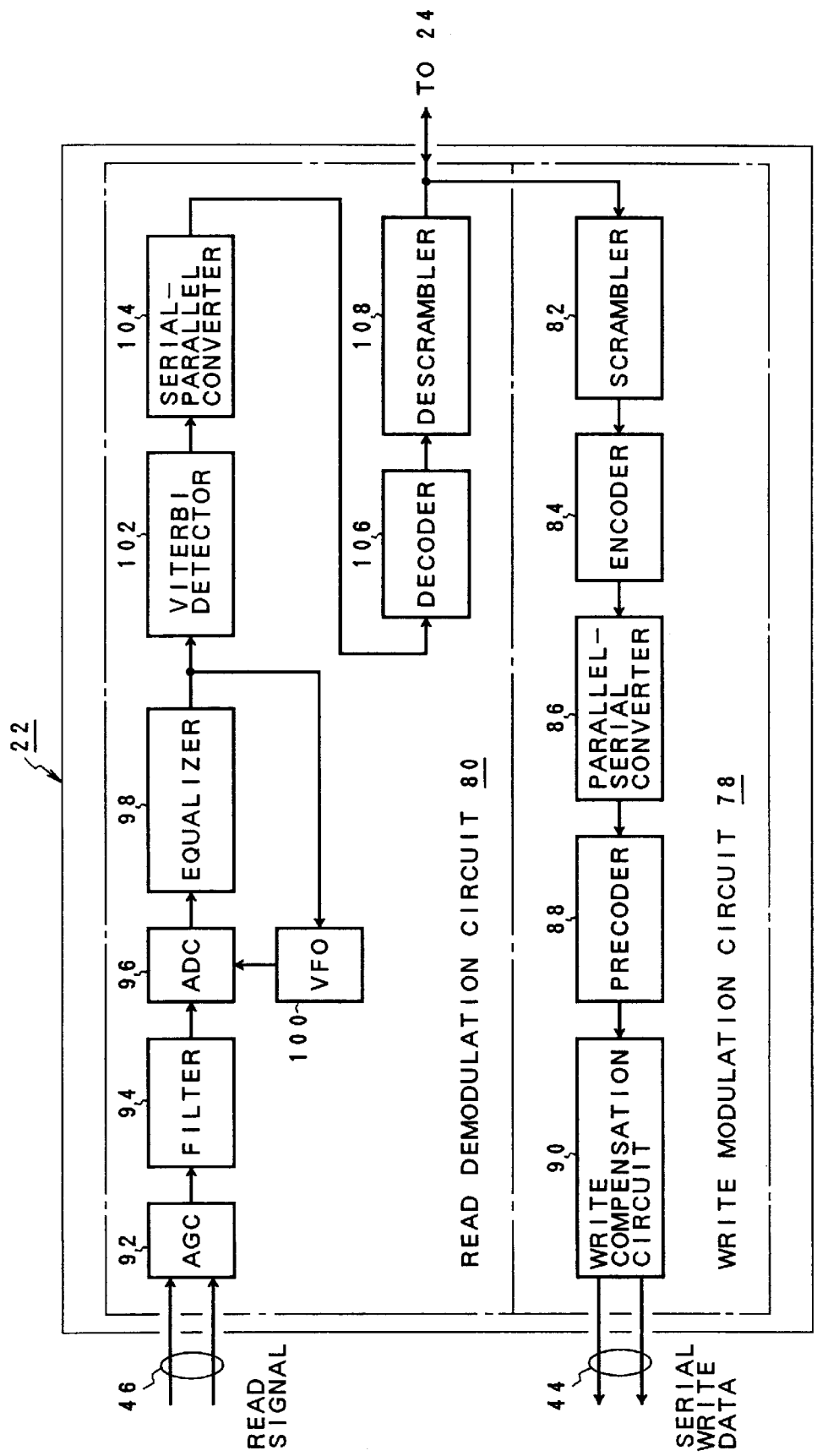
FIG. 6 is a block diagram of a read channel circuit of FIG. 2.

FIG. 6 is a block diagram of the read channel circuit 22 of FIG. 2. The read channel circuit 22 comprises a write modulation circuit 78 and a read demodulation circuit 80. The write modulation circuit 78 includes a scrambler 82, an encoder 84, a parallel/serial converter 86, a precoder 88 and a write compensation circuit 90. The write modulation circuit 78 receives write data formatted by the hard disk controller 22 of FIG. 2 and is subjected to a scramble based on EX-OR with a pseudo random pattern by the scrambler 82. Since the write data sector format consists of, e.g., a gap, a pilot, a sink byte, a data byte, an ECC and a gap, the scrambler 82 applies a scramble to the data byte and the ECC. Then the RLL encoder 84 converts it into, e.g., an 8/9 code. Then the parallel/serial converter 86 converts the existing byte data into serial data. If the read demodulation circuit 80 executes a partial response most likelihood (PRML) detection for example, the precoder 88 carries out a calculation of 1/(1+D) in advance upon the recording since an equalization of (1+D) is made upon the reproduction. Herein, D denotes a delay operator. In order to compensate in advance for a non-linear distortion of the magnetic media which may occur at a higher recording frequency, the write compensation circuit 90 makes a write compensation slightly shifting a write timing. Naturally, there is no need to provide the write compensation circuit 90 if no distortion occurs in the magnetic recording.

The read demodulation circuit 80 will then be described. The read demodulation circuit 80 includes an AGC circuit 92, a filter 94, an AD converter 96, an equalizer 98, a VFO (variable frequency oscillator) 100, a Viterbi detector 102, a parallel/serial converter 104, an RLL decoder 106 and a descrambler 108. The action of the read demodulation circuit 80 is as follows. An analog read signal from the head through the read only transmission path is subjected to an amplification by the automatic gain control provided by the AGC circuit 92, and then to a band limitation by low pass characteristic of the filter 94, and then converted by the AD converter 96 into digital read data on the basis of a sample clock from the VFO 100. The equalizer subjects the read data to an equalization of (1+D), and the Viterbi detector 102 demodulates the read data in accordance with a Viterbi algorithm. Herein, the VFO 100 provides a control of the sample clock in synchronism with a read signal which has been equalized by the equalizer 98. After the demodulation effected by the Viterbi detector 102, the read data are converted by the parallel/serial converter 104 into parallel data in byte unit for example, and then 8/9 inverted by the RLL decoder 106. Then the descrambler 108 descrambles the data byte and the ECC portions by use of a pseudo random code and provides the demodulated read data as its output to the hard disk controller 24, which in turn transfers it via the buffer memory 26 to the upper apparatus.

Figure 7:
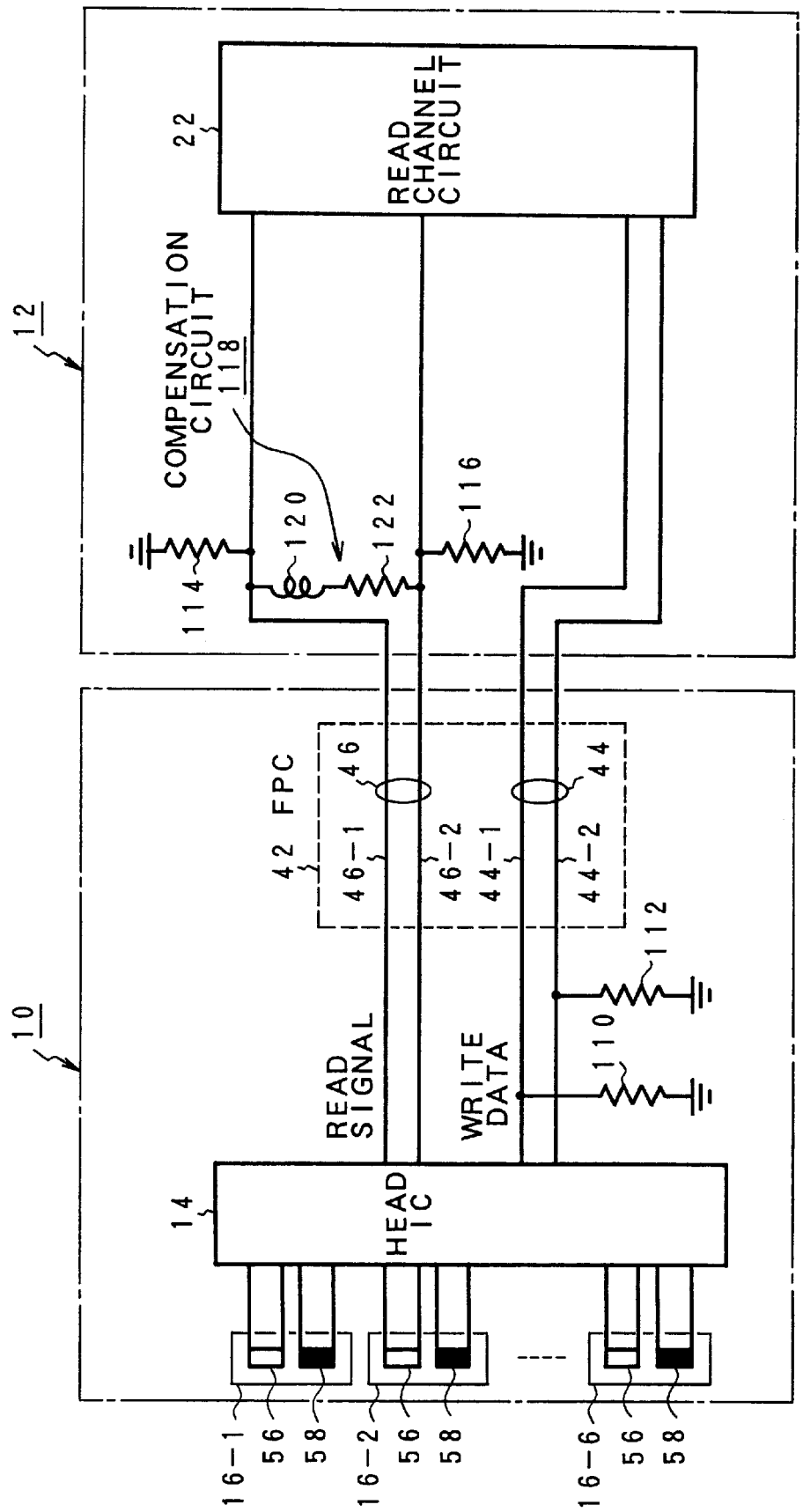
FIG. 7 is an explanatory diagram of an embodiment of a compensation circuit provided in a data transmission system of an storage apparatus of the present invention.

FIG. 7 illustrates an embodiment of a data transmission system intervening between the head disk assembly 10 and the control board 12 of the hard disk drive of FIG. 2. The head disk assembly 10 is provided with the head IC 14, to which are connected the head assemblies 16-1 to 16-6 each having the inductive head 56 and the MR head 58. The head IC 14 provided in the head disk assembly 10 and the read channel circuit 22 provided in the control board 12 are connected to each other by way of the write only transmission path 44 having a pair of transmission paths 44-1 and 44-2 and the read only transmission path 46 having a pair of transmission lines 46-1 and 46-2. The write only transmission path 44 and the read only transmission path 46 in the head disk assembly 10 extend through the FPC 42 connecting the head actuator 40 and the casing stationary side as shown in FIG. 3. In the region of the connection to the head IC 14 of the write only transmission path 44 which has passed through the FPC 42, there are provided terminating resistors 110 and 112 for write transfer interposed between the transmission lines 44-1 and 44-2 and the ground. For this reason, the write only transmission path 44 can have a transmission impedance depending on the terminating resistors 110 and 112 irrespective of whether the head IC 14 is in write action mode or not, with respect to the write compensation circuit 90 of the write modulation circuit 78 of FIG. 6 provided in the read channel circuit 22. On the other hand, after having passed through the FPC 42 of the head disk assembly 10, the read only transmission path from the head IC is connected to the read channel circuit 22 of the control board 12. Terminating resistors 114 and 116 are provided at the reception end which is the connection to the read channel circuit 22 and are interposed between the transmission lines 46-1 and 46-2 and the ground. In addition to these, the reception end of the read only transmission path 46 on the read channel circuit 22 is provided with a compensation circuit 118 for compensating for a frequency characteristic attributable to a stray capacitance which may occur between the transmission lines 46-1 and 46-2 of the read only transmission path 46 and between the transmission lines 46-1, 46-2 and the ground. The compensation circuit includes an inductance 120 and a resistor 122 connected in series to the pair of read only transmission lines 46-1 and 46-2. The compensation circuit 118 is provided for mainly compensating for a stray capacitance which may be parasitic on the pattern of the read only signal lines 46-1 and 46-2 formed on the FPC 42. It simultaneously compensates for a stray capacitance which may occur at the reception end side of the read channel circuit 22.

FIG. 8 illustrates an equivalent circuit provided between the ground and one transmission line 46-1 of the read only transmission path 46 which passes through the FPC 42 of FIG. 7 and is provided with the compensation circuit 118. In this equivalent circuit, a read amplifier current source 124 at the sending end corresponds to the preamplifier 75 and the read buffer 76 provided in the head IC 14 of FIG. 5 and generates a current i ($=g_m \cdot e_i$) obtained by multiplying an analog read voltage $e_i$ by the MR head 56 by a mutual conductance $g_m$ of the read amplifier. As a result of pass through the FPC 42, a stray capacitance 126 occurs between the transmission line 46-1 and the ground. This stray capacitance 126 results in a stray capacitance $2C_{01}$ double the capacitance generated between the transmission line 46-1 and the other transmission line 46-2. Then, the inductance 120 and the resistor 122 of the compensation circuit 118 provided on the control board 12 are connected in series between the transmission line 46-1 and the ground. Let L1 and R2 be a value of the inductance 120 and a value of the resistor 122, respectively, then there lies a series connection of (L1/2) and (R2/2) which are equal to half of the L1 and R2, respectively, between the transmission line 46-1 and the ground. Then one end of the terminating resistor 114 is connected to the transmission line 46-1, with the other end thereof connected to the ground. R1 denotes a resistance value of the terminating resistor 114. Connection is then made of a control board stray capacitance 128 which is parasitic on the reception end of the control board 12. In the same manner as the FPC stray capacitance 126, the value of the control board stray capacitance 128 results in a stray capacitance $2C_{02}$ double the capacitance generated between the transmission line 46-1 and the other transmission path. Then, there is acquired an output voltage $e_0$ transferred to the reception end which is a final end between the transmission line 46-1 and the ground, the output voltage $e_0$ being fed to the AGC circuit 92 of the read demodulation circuit 80 shown in FIG. 6. The following expressions give a transmission gain $G(\omega)$ and a transmission impedance Z of the equivalent circuit of the read only transmission line 46-1 of FIG. 8.

$$G(\omega) = \frac{e_0}{e_i} = \frac{iZ}{e_i} = \frac{g_m e_i Z}{e_i} = g_m Z \quad (1)$$

$$\frac{1}{Z} = j\omega 2(C_{01} + C_{02}) + \frac{1}{\frac{R_2}{2} + j\omega \frac{L_1}{2}} + \frac{1}{R_{1,3}} \quad (2)$$

where $C_{01}$ is a line capacitance of the FPC;

$C_{02}$ is a stray capacitance of the read channel; and $g_m$ is a mutual inductance of the read buffer.

As is apparent from the expression (1), the transmission gain $G(\omega)$ depends on the transmission impedance Z, which as is apparent from the expression (2) depends on the frequency f given as $\omega=2\pi f$. That is, when the frequency f is increased, the impedance component by the stray capacitance $C_{01}$ and $C_{02}$ lowers but the component by the inductance L1 increases. For this reason, by appropriately selecting the value of the inductance L1 provided in the compensation circuit 118 with respect to the stray capacitance $C_{01}$ and $C_{02}$, it is possible to suppress a reduction of the impedance attributable to the stray capacitance in the high-frequency component and to widen the band of the transmission characteristics of the analog read signal by suppressing the attenuation of the high-frequency component.

Figure 9:
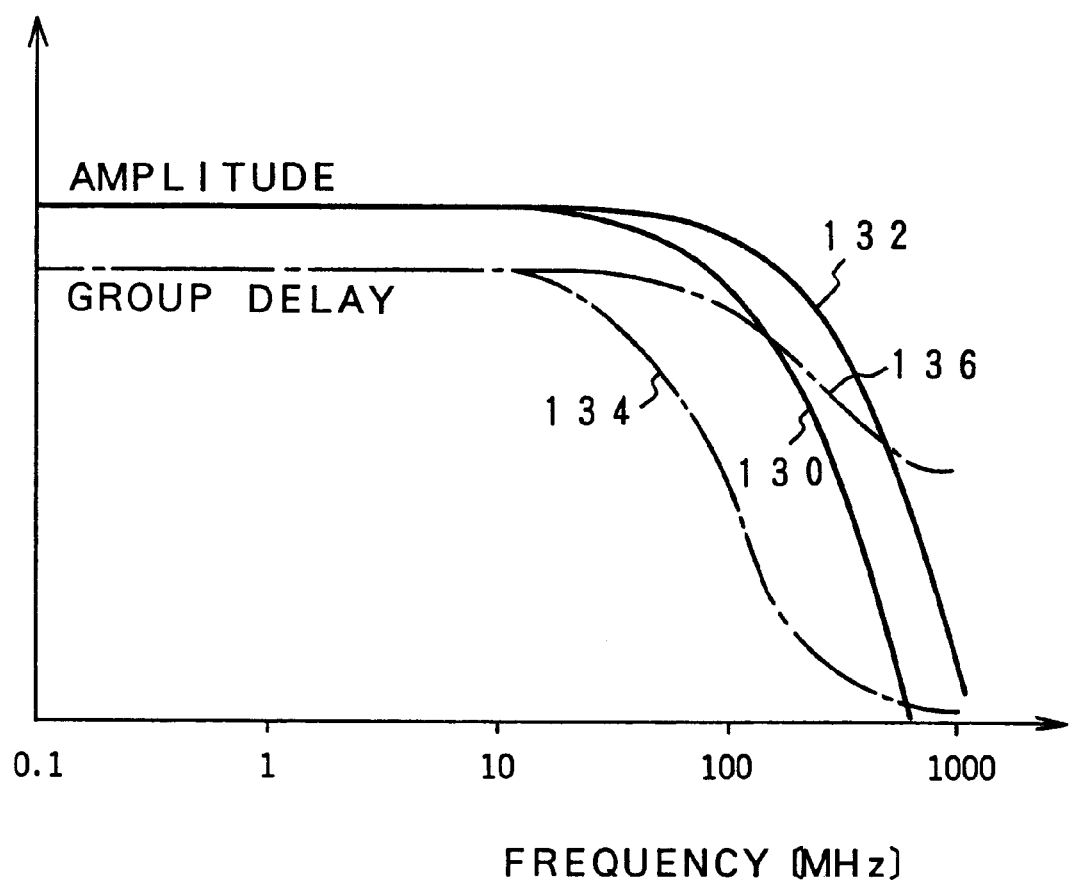
FIG. 9 is a frequency characteristic diagram of a read signal with respect to the amplitude and the group delay, obtained by the compensation circuit of FIG. 7.

FIG. 9 illustrates frequency characteristics of the amplitude and the group delay of the read only transmission path 46 implemented by the equivalent circuit 118 of FIG. 7. Herein, R1=R3=100 Ω where R1 and R3 are resistance values of the terminating resistors 114 and 116, respectively, associated with the read only transmission path 46 provided on the control board 12 of FIG. 7; $C_{01}=C_{02}=9.5$ pF where $C_{01}+C_{02}$ denote stray capacitance occurring on the FPC 42 and the control board 12; L1=0.1 μH where L1 is a value of the inductance 120 of the compensation circuit 118; and R2=200 Ω where R2 is a resistance value of the resistor 112. Attention being paid first to the amplitude vs. frequency characteristics of FIG. 9, an amplitude characteristic 130 is obtained in case of no provision of the compensation circuit 118. In contrast with this, the provision of the compensation circuit 118 contributes to an improvement in the attenuation of the high-frequency component exceeding 100 MHz as shown in an amplitude characteristic 132, to achieve a wider band of the amplitude components. In this case, the resistance value R2 of the resistor 122 provided in the compensation circuit 118 is a value for regulating the peaking value of the amplitude characteristic 132. The resistance value R2 of the resistor 122 provided in the compensation circuit 118 cooperates partially with the terminating resistors 114 and 116. Attention being paid then to the group delay vs. frequency characteristics, a group delay characteristic 134 is obtained when no compensation circuit 118 is provided. In contrast with this, the provision of the compensation circuit 118 contributes to a remarkable improvement in a drop of the delay in the high-frequency components exceeding 100 MHz as in a group delay characteristic 136, to thereby realize a wider band. Although the equivalent circuit of FIG. 8 is an equivalent circuit of the transmission line 46-1 on one hand of the read only transmission path of FIG. 7, the transmission line 46-2 on the other can be obtained by merely replacing the terminating resistor 114 by the terminating resistor 116.

Figure 10:
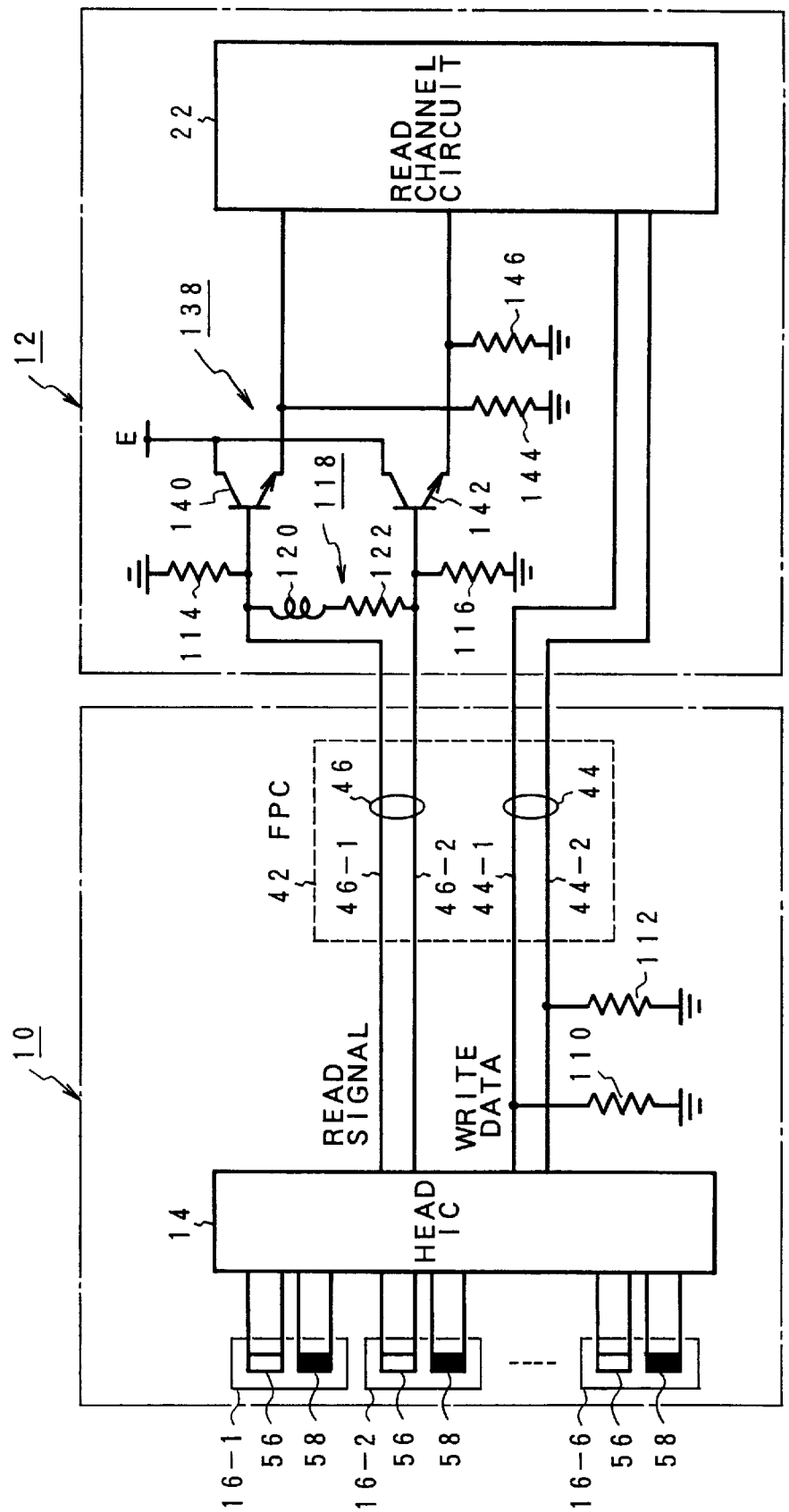
FIG. 10 is an explanatory diagram of another embodiment of a compensation circuit provided in the data transmission system of the storage apparatus of the present invention.

FIG. 10 illustrates another embodiment of read and write transmission systems between the head disk assembly 10 and the control board 12 in the hard disk drive of FIG. 2. A write only transmission path 44 and a read only transmission path 46 provided between the head IC 14 of the head disk assembly 10 and the control board 12 extend through the FPC 42 provided in the head disk assembly 10. Between them, the write only transmission path 44 is the same as that of FIG. 7, although the compensation circuit 118 associated with the read only transmission path 46 on the control board 12 is additionally provided with an emitter follower circuit 138 serving as a buffer amplifier. More specifically, in addition to the terminating resistors 114 and 116 for read transmission and the series circuit of the inductance 120 and the resistor 122 constituting the compensation circuit 118, the reception end of the read only transmission path 46 connected to the control board 12 is further provided for the transmission lines 46-1 and 46-2 with transistors 140 and 142, respectively, serving as buffer amplifiers and the emitter follower circuit 138 having emitter resistors 144 and 146, respectively. The provision of the emitter follower circuit 138 enables the stray capacitance which may occur in the compensation circuit 118 on the read channel circuit 22 side to be eliminated by a supply of an emitter current from the transistors 140 and 142.

FIG. 11 illustrates an equivalent circuit diagram of the read transmission system of FIG. 10. This equivalent circuit is an equivalent circuit obtained by excluding the stray capacitance 128 on the control board side from the equivalent circuit of the compensation circuit 118 having no emitter follower of FIG. 8. The following expressions give a transmission gain $G(\omega)$ and a transmission impedance Z of the read transmission system of this equivalent circuit.

$$G(\omega) = \frac{e_0}{e_i} = \frac{iZ}{e_i} = \frac{g_m e_i Z}{e_i} = g_m Z \quad (3)$$

$$\frac{1}{Z} = j\omega 2C_{01} + \frac{1}{\frac{R_2}{2} + j\omega \frac{L_1}{2}} + \frac{1}{R_{1,3}} \quad (4)$$

where $C_{01}$ is a line capacitance of the FPC;

$C_{02}$ is a stray capacitance of the read channel; and $g_m$ is a mutual inductance of the read buffer.

In this embodiment of FIG. 10 as well including the compensation circuit 118 provided with the emitter follower circuit 138 for eliminating the stray capacitance on the control board side, the provision of the compensation circuit 118 makes it possible to achieve a wider band suppressing the attenuation of the high-frequency components of an analog read signal in the same manner as the amplitude characteristic 132 and the group delay characteristic 136 of FIG. 9.

Figure 12:
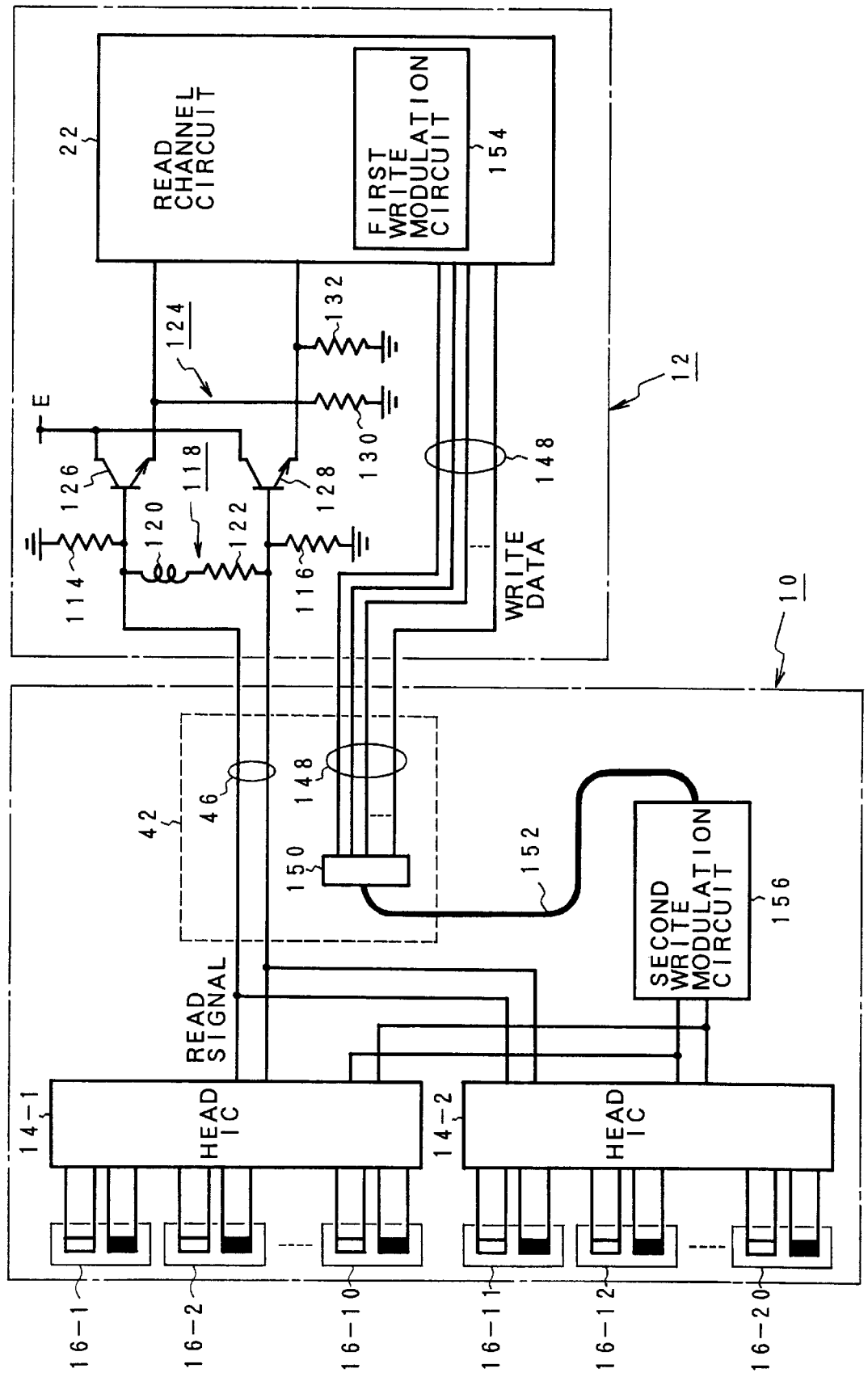
FIG. 12 is an explanatory diagram of another embodiment of the present invention having a parallelized write transmission system.

FIG. 12 illustrates a further embodiment of the hard disk drive of FIG. 2 in accordance with the present invention.

This embodiment is characterized by a parallelization of the write transmission path extending from the control board 12 to the head IC of the head disk assembly. The head disk assembly 10 comprises head ICs 14-1 and 14-2 which include head assemblies 16-1 to 16-10 and 16-11 to 16-20, respectively. The read only transmission paths 46 from the head ICs 14-1 and 14-2 are connected to each other in parallel and then pass through the FPC 42. The paths 46 are then connected to the read channel circuit 22 of the control board 12, with its connecting portion as a reception end being mounted with the compensation circuit 118 provided with the emitter follower circuit 138 in the same manner as the embodiment of FIG. 10. On the other hand, the write transmission path connecting the read channel circuit 24 of the control board 12 and the head ICs 14-1 and 14-2 of the head assembly 10 is in the form of parallel write data transmission paths 148 for the parallel transfer of 8-bit data on a byte-to-byte basis for example. The parallel write data transmission paths 148 from the control board 12 extend through the FPC 42 to a connector 150. A parallel transmission path 152 from the connector 150 reaches a second write modulation circuit 156 obtained by separating a serial circuit portion from a write modulation circuit provided in the read channel circuit 22 on the control board 12. For this reason, the read channel circuit 22 includes a first write modulation circuit 154 serving as a circuit portion for the parallel data processing, from which the second write modulation circuit 156 serving as the serial circuit portion on the head disk assembly 10 side has been excluded.

Figure 13:
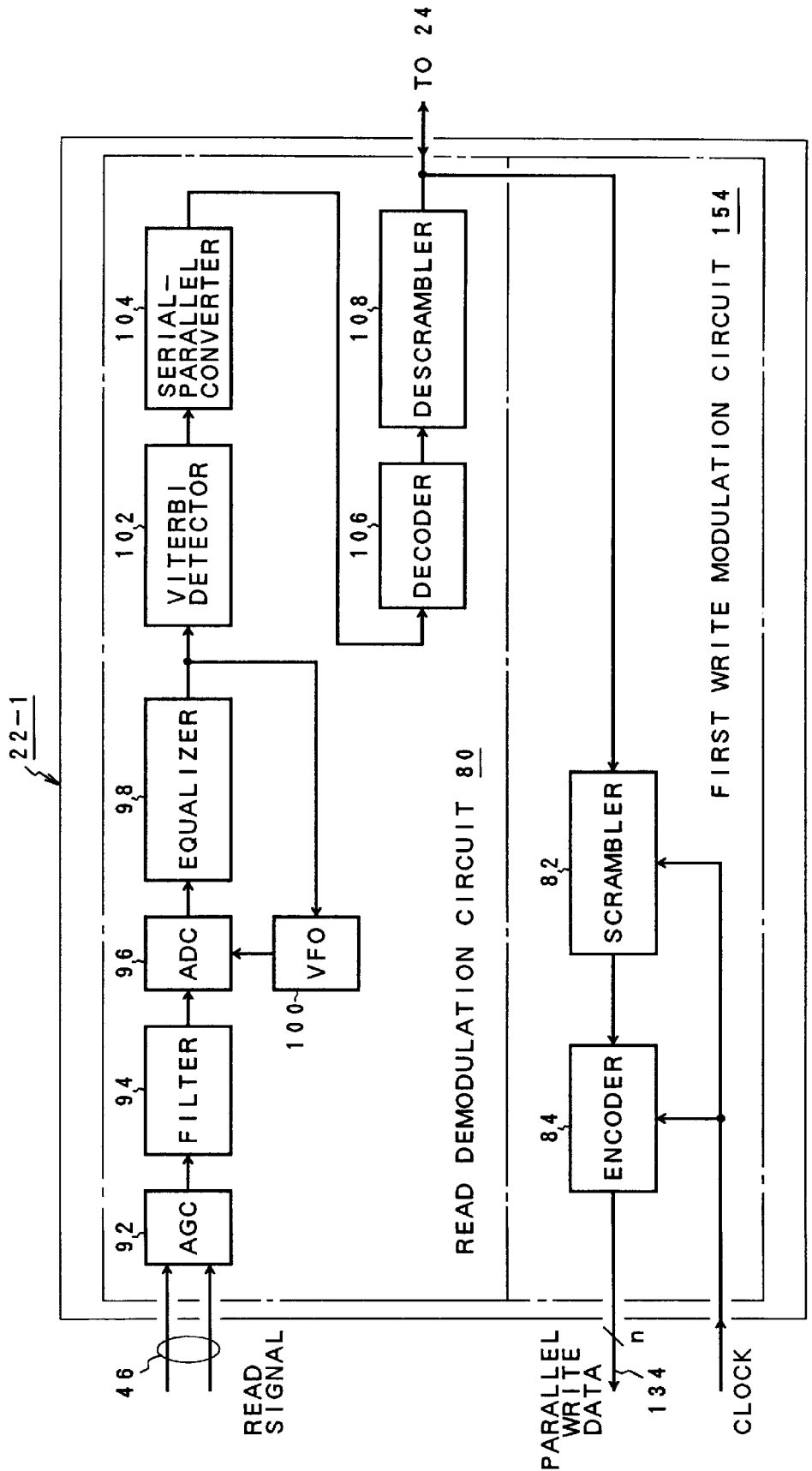
FIG. 13 is block diagram of a read channel circuit for use in FIG. 12.
Figure 14:
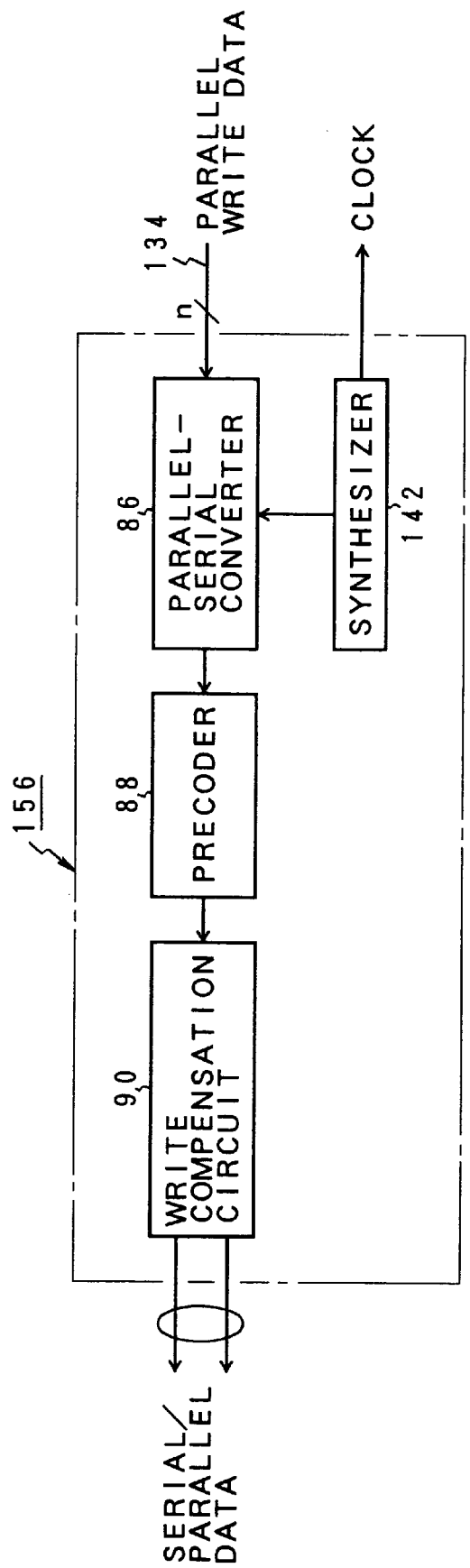
FIG. 14 is a block diagram of a second write modulation circuit provided on the head actuator of FIG. 12.

FIG. 13 is a block diagram of the read channel circuit 22 of FIG. 12. The read channel circuit 22 has the same read modulation circuit 80 as in FIG. 6, but has a different write modulation circuit in the form of the first write modulation circuit 154 including only the scrambler 82 and the RLL encoder 84. The other elements of the write modulation circuit 78 of FIG. 6, that is, the parallel/serial converter 86, the precoder 88 and the write compensation circuit 90 are moved into the second write modulation circuit 156 provided in the head disk assembly 10 of FIG. 12. The second write modulation circuit 156 further includes a synthesizer 142 which generates a clock upon the writing action to allow a converting action of the parallel/serial converter 86 and returns a clock to the first write modulation circuit 154 of FIG. 13 to allow the action of the scrambler 82 and the encoder 84. In this manner, the write data transmission path extending from the control board 12 to the head disk assembly 10 is provided in the form of, e.g., an 8-bit parallel write data transmission path 148 so that the clock frequency at the write transmission path can be reduced to ⅛ of the recording frequency on the magnetic disk media, to thereby ensuring a higher transmission quality of the write transmission system by fully lowering the write data transfer speed even though the data transmission speed has been increased with the increase of the clock frequency. Naturally, the parallel write data transmission path 148 of FIG. 12 employed by way of example a parallel transmission of 8 bits per byte, although any appropriate parallel bit transmission could be used as long as it is a parallel transmission of two or more bits.

According to the present invention as set forth hereinabove, a read signal from the head is amplified by the read amplifier disposed on the head actuator side and is fed via the pair of read only transmission paths through the FPC to the control board, with the read only transmission paths being provided with the compensation circuit having the series circuit consisting of the inductance and the resistor, whereby there is compensated for an attenuation of the analog read signal at a high frequency band attributable to the stray capacitance of the FPC which may occur in the read only transmission paths and to the stray capacitance on the control board side to thereby improve the frequency characteristic of the read transmission paths in spite of the existence of the stray capacitance to achieve a broader band, to consequently ensure an appropriate transfer quality of a high speed data transfer to achieve a correct reproduction of the read data through a satisfactory transmission of the analog read signal.

Furthermore, by providing the stray capacitance compensation circuit of the read only transmission paths with the buffer amplifier, it is possible to eliminate the stray capacitance on the control board side and to reduce the constant of the compensation circuit since only the compensation of the FPC stray capacitance is required, to thereby simplify the circuit configuration.

The separation of the read only transmission paths and the write only transmission path prevents the compensation circuit from acting on the write only transmission path even though the compensation circuit for the compensation of the stray capacitance has been provided on the read only transmission paths, thereby eliminating a risk to cause a refection loss attributable to the impedance mismatching of the write only transmission path by the compensation circuit.

Furthermore, the write only transmission path employs a parallel write data transfer line between the control board and the head actuator to allow a parallel N-bit transfer for obtaining 1/N write data transfer speed, thereby enabling the write data transfer to easily deal with an increase of the recording frequency on the media depending on the transfer speed of the serial write data.

Although in the above embodiment the description has been made by way of example of the magnetic disk drive employing the recording/reproduction method based on the partial response most likelihood (PRML) detection, the present invention is not limited to this, a peak detection method or other recording/reproduction method could intactly be employed. Furthermore, the magnetic head was in the form of a composite head consisting of the inductive type and the magnetic reluctance type by way of example, but instead an inductive type head for use both in reading and writing could be employed.

In the embodiment of FIG. 10, the emitter follower circuit 138 serving as the buffer amplifier is mounted on the reception end of the read channel circuit 22 so as to constitute a part of the compensation circuit 118. But instead, the emitter follower circuit 138 may be incorporated into the IC of the read channel circuit 22.

Furthermore, the inductance 120 of the compensation circuit 118 may be formed from wiring patterns within the IC constituting the read channel circuit 22 such that the IC of the read channel circuit 22 incorporates not only the emitter follower circuit 138 but also the series circuit consisting of the inductance 120 and the resistor 122 of the compensation circuit 118.

It is to be appreciated that the present invention is not limited to the above embodiments and can be variously modified without impairing the object and the advantages of the invention. The present invention is not intended to be limited by numerical values shown in the above embodiments.

What is claimed is:
1. A storage apparatus comprising:
   a head actuator for positioning a head relative to a disk medium;
   a flexible printed circuit for electrically connecting said head actuator and a fixed side, said flexible printed circuit having a predetermined length required for a motion of said head actuator;

a read amplifier disposed on said head actuator side, for amplifying an analog read signal from said head;

a pair of read only transmission paths for feeding an output signal from said read amplifier via said flexible printed circuit to a control board; and a compensation circuit disposed on said pair of read only transmission paths, for compensating for a degradation of frequency characteristics of said analog read signal attributable to stray capacitance of said flexible printed circuit and to stray capacitance on said control board side.

2. A storage apparatus according to claim 1, wherein said compensation circuit includes an inductance and a resistor connected in series between said pair of read only transmission paths.

3. A storage apparatus according to claim 1, wherein said compensation circuit includes an inductance and a resistor connected in series between said pair of read only transmission paths and includes a pair of terminating resistors each having one end connected to corresponding one of said pair of read only transmission paths and the other end connected to the ground.

4. A storage apparatus according to claim 1, wherein said compensation circuit includes an inductance and a resistor connected to in series between said pair of read only transmission paths and includes a pair of terminating resistors each having one end connected to corresponding one of said pair read only of transmission paths and the other end connected to the ground and includes a pair of buffer amplifiers provided on said read only transmission paths, respectively, for eliminating stray capacitance on said control board side.

5. A storage apparatus according to claim 4, wherein said buffer amplifier is an emitter follower circuit.

6. A storage apparatus according to claim 1, wherein said compensation circuit is mounted on reception ends of said pair of transmission paths on said control board.

7. A storage apparatus according to claim 1, wherein an output circuit of said read amplifier is a read buffer circuit of open collector type.

8. A storage apparatus according to claim 1, further comprising:

a write amplifier disposed on said head actuator side, for feeding a write current into said head to thereby record data on said disk medium;

a pair of write only transmission paths through which write data from said control board are fed via said flexible printed circuit to said write amplifier; and a pair of terminating resistors each having one end connected to corresponding one of reception ends of said pair of write only transmission paths on said write amplifier and having the other end connected to the ground.

9. A storage apparatus according to claim 1, further comprising:

a write amplifier disposed on said head actuator side, for feeding a write current into said head to thereby record data on said disk medium;

a first write modulation circuit disposed on said control board, for providing a parallel output of write data;

a parallel write transmission path through which parallel write data from said first write modulation circuit are fed via said flexible printed circuit to said head actuator side; and a second write modulation circuit disposed on said actuator side, for converting parallel write data transferred from said parallel write transmission path into serial write data.

10. A storage apparatus according to claim 9, wherein said first write modulation circuit mounted on said control board includes a scrambler and an RLL encoder, and wherein said second write modulation circuit mounted on said head actuator side includes a parallel/series converter, a precoder and a write compensation circuit.

* * * * *

UNITED STATES PATENT AND TRADEMARK OFFICE
CERTIFICATE OF CORRECTION

PATENT NO. : 6,166,872
DATED : December 26, 2000
INVENTOR(S) : Uno et al.

Page 1 of 1

It is certified that error appears in the above-identified patent and that said Letters Patent is hereby corrected as shown below:

Claim 4,
Line 6, delete "read only of" and insert -- of read only -- therefor.

Signed and Sealed this

Eighteenth Day of December, 2001

Attest:

JAMES E. ROGAN
*Attesting Officer*     *Director of the United States Patent and Trademark Office*